US007615985B2

(12) United States Patent
Dine et al.

(10) Patent No.: US 7,615,985 B2
(45) Date of Patent: Nov. 10, 2009

(54) PROBE FOR MEASURING CHARACTERISTICS OF AN EXCITATION CURRENT OF A PLASMA, AND ASSOCIATED PLASMA REACTOR

(75) Inventors: Sébastien Dine, Paris (FR); Jacques Jolly, Verrieres le Buisson (FR); Jean Bernard Pierre Larour, Viroflay (FR)

(73) Assignees: Ecole Polytechnique, Palaiseau (FR); Centre National de la Recherche Scientifique (CNRS), Paris (FR)

( * ) Notice: Subject to any disclaimer, the term of this patent is extended or adjusted under 35 U.S.C. 154(b) by 229 days.

(21) Appl. No.: 11/663,129

(22) PCT Filed: Sep. 15, 2005

(86) PCT No.: PCT/EP2005/054599

§ 371 (c)(1), (2), (4) Date: Mar. 16, 2007

(87) PCT Pub. No.: WO2006/030024

PCT Pub. Date: Mar. 23, 2006

(65) Prior Publication Data

US 2007/0252580 A1 Nov. 1, 2007

(30) Foreign Application Priority Data

Sep. 16, 2004 (FR) .................................. 04 09811

(51) Int. Cl.
*G01R 31/02* (2006.01)
*G01R 1/06* (2006.01)

(52) U.S. Cl. ...................................... 324/72.5; 324/149

(58) Field of Classification Search ................ 324/72.5, 324/149
See application file for complete search history.

(56) References Cited

U.S. PATENT DOCUMENTS

| | | | | |
|---|---|---|---|---|
| 5,808,415 | A | 9/1998 | Hopkins | |
| 5,834,931 | A | 11/1998 | Moore et al. | |
| 6,239,587 | B1 | 5/2001 | Buck | |
| 6,449,568 | B1 * | 9/2002 | Gerrish | 702/60 |
| 6,501,285 | B1 | 12/2002 | Hopkins et al. | |
| 7,154,256 | B2 * | 12/2006 | Parsons et al. | 324/72 |

FOREIGN PATENT DOCUMENTS

WO 02/054091 A2 7/2002

* cited by examiner

*Primary Examiner*—Amy He
(74) *Attorney, Agent, or Firm*—Pauley Peterson & Erickson

(57) ABSTRACT

A probe for measuring electrical characteristics of an excitation current of a plasma is provided. The probe is mounted on a conductive line that includes an inner conductor and an outer conductor. The probe includes a current sensor and a voltage sensor. The current sensor includes a groove formed in the ground of one of the conductors in order to form a detour for the current flowing through the conductor, and a point for measuring electric voltage between a ground connected to the conductor and a point of the groove. The current sensor thus is able to measure a voltage proportional to the first time derivative of intensity ($I_{plasma}$) of the excitation current. The voltage sensor is a shunt sensor capable of measuring a voltage proportional to the first time derivative of the voltage ($V_{plasma}$) of the excitation current. A plasma reactor including a probe of the aforementioned type is also provided.

13 Claims, 7 Drawing Sheets

PROBE FOR MEASURING CHARACTERISTICS OF AN EXCITATION CURRENT OF A PLASMA, AND ASSOCIATED PLASMA REACTOR

BACKGROUND OF THE INVENTION

1. Field of the Invention

The invention relates to a device for measuring electric current and voltage in a power feeding circuit of a plasma. In this document, such a device will be referred to as a "probe".

2. Discussion of Related Art

The uses of the invention relate to all of the plasma-assisted industrial processes employed within a plasma reactor. In particular, such processes include (though this list is not exhaustive):

- plasma etching (used in particular in microelectronics or in the nanotechnology area),
- deposition of layers assisted by plasma (used, for example, for the manufacture of flat liquid crystal screens, etc.), and
- applications for which the plasma is used as a light source or as a device for the treatment of gaseous effluents in pollution control applications or even as a thermonuclear fusion reactor, etc.

The invention also applies to measurement of the electric current and the voltage in a plasma reactor using one or more variable electric voltage or current sources.

For processes such as those mentioned above, the invention can be used to ascertain, in real time and without disrupting the execution of the process, the essential electrical properties or characteristics of the plasma (current and voltage, but also the phase offset between current and voltage, etc.), and thus allows the modification, in real time, of the properties or characteristics of the electrical sources employed in these processes, in order to alter the characteristics of the plasma.

Such a modification in real time can be used to perform real-time control by means of a non-disruptive diagnosis based on the electrical measurements, in order to prevent process drifting or runaway.

One use of the invention is the control of these processes using the electrical measurements supplied by the probe.

Presentation of a Plasma Reactor

Prior to the description of forms of implementation of the invention, the following is a presentation of some characteristics of one (non-limiting) example of a plasma reactor that can be employed in the context of the invention.

Plasma reactors can be used to coat a sample with a thin layer of material, to etch a sample by ionic bombardment, or more generally to change the structure or chemical composition of a surface.

A plasma reactor can also be used as a light source or as a device for the treatment of gaseous effluents in pollution control applications, or even as a thermonuclear fusion reactor.

FIG. 1 schematically represents, in cross section, an example of a plasma reactor to which the invention applies. This reactor can, for example, be of the radio-frequency (RF) excitation type by capacitive or inductive coupling.

Such a reactor includes an enclosure under vacuum 53. Close to a first wall 54 of this enclosure, on a substrate holder 55, is placed a sample 56 to be treated.

The sample 56 is in the general shape of a disk of which one surface is directed toward the interior of the enclosure 53 and constitutes the surface to be treated.

The enclosure 53 is filled with a gas at low pressure, of the order of a few tens to a few hundreds of millitorrs, for example (a few tens to a few hundreds of pascals). The gas is obtained from a source 57 to be injected into the enclosure of the reactor via a gas feed pipe 58, with the gas flow being regulated by a flowmeter 59.

When a gas mixture is used, several sources, flowmeters and feed pipes are used in parallel. The gas is evacuated from the enclosure 53 via an evacuation pipe 60 connected to a pumping system 61 composed of one or more vacuum pumps in series. The pumping rate in terms of volume is adjusted by means of a valve 62.

The pressure in the enclosure is controlled with the valve 62 and/or the flowmeter 59.

A plasma reactor can also function at atmospheric pressure or in a low vacuum (pressure of gas between a tenth of one atmosphere and an atmosphere). The treatment of gaseous effluents for pollution control applications is often conducted at these pressures.

This is also the case for the continuous treatment of a large surface such as the deposition of layers onto window panes or cleaning steel sheeting as it leaves a rolling mill.

Several means can be used to generate the plasma 63. For example, in a configuration described as "reactive ionic etching by capacitive coupling", a radio-frequency voltage is applied to the substrate holder. It is also possible, as shown in FIG. 1, to generate the plasma 63 by means of a source 64 that is independent of the substrate holder 55.

This source 64 can be associated with a generator 65 for the following source types for example:

- an electrode powered by a high-frequency generator (capacitive source),
- an electrode powered by a low-frequency generator,
- an electrode powered by voltage pulses delivered by a pulse generator,
- a coil powered by a radio-frequency generator (inductive source), and
- a microwave generator.

Where appropriate, the last two of the above-identified source types, i.e., inductive and microwave, can be associated with the use of a static magnetic field. In the case of the use of a source that is independent of the substrate holder, the latter can be polarized by a radio-frequency source 66 to establish a self-polarization and thus to increase the impact energy of the ions on the surface to be treated.

When the plasma source is a radio-frequency source, the latter can, where appropriate, be polarized at a higher frequency than that applied to the substrate holder 55 with the aim of preferentially controlling the electron density.

When the plasma source is a radio-frequency source (HF, VHF or microwave), an impedance matching or matching circuit 67 is placed between the generator 65 and the plasma source 64. This circuit is connected to the generator 65 by a transmission line 68, generally coaxial, with a characteristic impedance of 50 ohms. An impedance matching circuit is used to prevent the reflection of electromagnetic energy to the source. This firstly allows the source to be protected and secondly allows the transfer of power to the plasma to be optimized. This circuit modifies the electrical impedance of the plasma source in order to render it equal to the characteristic impedance of the line 68. The transmission line 68 is said to be matched. The matching circuit 67 is connected to the plasma source 64 by a coaxial or radial transmission line 69. This line is not matched since the impedance of the plasma source is not equal to the characteristic impedance of the line 69.

When the substrate holder is powered by a radio-frequency source, a matching circuit 70 is inserted between the substrate holder and the source. The latter is connected to the matching circuit by matched coaxial transmission line 71 whose characteristic impedance is generally equal to 50 ohms. The output of the impedance circuit 70 is connected to the substrate holder by an unmatched radial or coaxial transmission line 72.

The plasma processes using a radio-frequency source most often use a frequency in the high-frequency area (HF band: 3 MHz-30 MHz). Within this range, the frequency most often used is 13.56 MHz.

The plasmas affected by the invention include chemically reactive plasmas (in which both chemical reaction and ionic bombardment can be used).

Just the reactivity of the gas or of the gas mixture injected into the enclosure is sometimes the only phenomenon employed. In general this reactivity is improved or even generated by the collisions of the electrons with neutral atoms or molecules, thus producing radicals, e.g., unstable chemical species which are absent in the gas without the presence of the electrons. These radicals, as well as the reactive ions, are responsible for the deposition or the etching. In the case of deposition, we speak of chemical deposition on the plasma-assisted vapor phase. This reactivity initiated by the electrons avoids the need for significant heating of the gas or of the substrate holder, which would damage the sample to be treated.

The rate of production of radicals by electron collisions is a function of the electron concentration. Likewise, the flow of charged particles (electrons and ions) arriving at and leaving the surface to be treated is proportional to the electron concentration. Chemical reactivity and ionic bombardment generally act in synergy in these plasmas.

The electron concentration and the flow of ions are proportional to the electric current in the plasma. The flow of ions and the energy of the ions bombarding the surface to be treated are proportional to the voltage applied to the substrate holder 55 or to the electrode 64 in the case of a capacitive coupling source.

In a process of deposition or etching by plasma, it is important to know the characteristics of the plasma in order to be able to control the execution of the process and its reproducibility, in particular to control the speed of deposition or etching in accordance with the thickness of the deposition or the depth of the etching desired.

After deposition or etching, all the surfaces (electrodes, walls, etc.) exposed to the plasma are coated with a deposit that has to be removed in order to treat a fresh sample. This cleaning stage is often effected by means of a plasma, making use of both chemical reactivity and ion bombardment.

Measurement of the current flowing in the plasma or of the voltage applied to the electrodes 55 or 64 is therefore a means of controlling the characteristics of the plasma without disrupting it. This measurement is performed during the process or during the cleaning, and is preferably effected on the unmatched transmission lines 69 and 72 in order to be performed as close as possible to the plasma. The measuring probe can also be located on the matched transmission lines 68 and 71 in order to measure the quality of the impedance matching and, where necessary, to change the characteristics of the impedance matching circuits 67 and 70, and to improve the degree of matching of the lines 68 and 71.

Measurement of the current and of the voltage can be associated with a device designed to measure the phase offset between the current and the voltage, in order to deduce the power dissipated in the plasma and the impedance of the plasma. These last two parameters, as well as the amplitudes of the voltage and current, are useful for controlling the correct operation of these processes and the stages for plasma cleaning of the reactors. They can be used where appropriate to control a feedback loop in order to prevent drifting or run-away of the process. The quality of this control is strongly dependent upon the performance of the probe used to measure the current and the voltage.

Note that the invention applies more particularly to plasmas that are excited by a variable source of electric current or of voltage, such as a sinusoidal or pulse-type voltage generator.

The invention more precisely finds particularly advantageous applications in such plasmas excited with a sinusoidal radio-frequency voltage at a frequency of between 1 MHz and 1 GHz.

The electrical impedance of a plasma depends on the current flowing in the plasma, and is said to be non-linear. One of the consequences of this non-linearity is that a plasma excited by an alternating voltage source of frequency f generates harmonics of this excitation voltage at frequencies that are a multiple of f. For example, for a plasma generated by a sinusoidal voltage at 13.56 MHz, sinusoidal components at 27.12 MHz, 40.68 MHz, 54.24 MHz, etc., appear in the voltage and current measurement signals.

In the course of an industrial process such as those mentioned above, measuring the changes of the amplitude of these harmonics with time, in addition to the amplitude of the fundamental frequency in the course of an industrial process, has broad applications.

Such measurement can in particular be used to detect the end of the etching by plasma of a dielectric layer on a microprocessor during its manufacture. Note that the amplitudes of these harmonics at frequencies 2f, 3f, 4f, etc. are far lower than the amplitude of the fundamental component f, and that it is therefore necessary to be able to isolate them from this fundamental component by filtering.

In addition, plasma processes using a radio frequency greater than 13.56 MHz, and particularly in the very high frequency areas (the VHF band in particular, namely 30 MHz-300 MHz) are becoming common.

At such frequencies, the voltage and current probes have to operate over a very wide frequency range, since the frequency difference between each harmonic of the fundamental frequency component is higher than in the case where the fundamental frequency used is lower (13.56 MHz, for example).

Most of the existing probes designed to work at 13.56 MHz are therefore not usable at VHF. It would therefore be advantageous to be in possession of a probe designed to operate over a wide frequency range.

In addition, the size of the plasma-assisted etching and deposition reactors used in industry also tend to grow in order to treat a larger number of devices in a single operation.

These large-sized reactors necessitate the use of higher electrical RF powers. The RF currents and voltages to be measured also increase.

The risks of heating, short-circuit and material breakdown also increase at these higher currents and voltages, and so it would be advantageous to reduce these risks, in particular in order to be able to measure currents and voltages of large magnitude.

As explained above, it is often desired to measure the current and the voltage on the electrical power feeding circuit of the plasma process.

It is also often desired to determine the phase offset between the current and the voltage in order to deduce from this the power dissipated in the plasma and the impedance of the latter.

The quality of the measurement of phase offset is strongly dependent upon the performance of the sensor employed to measure the current and the voltage. This measurement should be precise, since the variations of phase offset are often very small.

It is observed with known voltage and current probes that the phase offset measured between the current and the voltage is affected by an error (this error generally becoming greater as the current and voltage sensors of the probe are more distant from each other). It would naturally be desirable to eliminate this type of error.

The solution, which would consist of bringing to the same level the current and voltage sensors of a probe of previous design (such as that shown in FIG. 2) in order to attempt to get around this type of error, would also increase the risk of mutual interference and would result in a degradation of the frequency response. The working frequency range of the probe would then be reduced. It is therefore necessary with this known type of probe to find a compromise between the risk of mutual disruption, the degradation of the phase offset measurement, and the working frequency range.

As mentioned above, there already exist probes that are designed to measure the current and the voltage delivered to a plasma.

FIG. 2 thus presents, in longitudinal section, a probe 10 mounted on an electrically conducting coaxial transmission line 20 which includes an inner conductor 21 and an outer conductor 22 that surrounds the inner conductor.

The coaxial line 20 is connected:

- by its two conductors to an impedance matching circuit (not shown in the figure) which is also connected to an RF alternating voltage source (or RF generator) which excites the plasma (connection by the part of the line at the top of the figure),
- by its inner conductor, to a radio-frequency electrode 31 in the form of a solid disk—only the cross-section of this disk appears in the figure (connection by the part of the line at the bottom of the figure), and
- by its outer conductor to a conducting lid 32 which is also in form of disk and located facing and distant from the electrode 31 so as to form a space 30 between the electrode and the lid. The lid 32 is also electrically conducting.

The coaxial line 20 described above corresponds, for example, to line 69 or line 72 in FIG. 1. The radio-frequency electrode 31 corresponds, for example, to the substrate holder 55 or to the plasma source 64 of FIG. 1. The lid 32 corresponds, for example, to the enclosure 53 or to the wall 54 of the vacuum chamber of FIG. 1.

Between the RF generator and the matching circuit, the line is said to be matched. Between the matching circuit and the plasma, the line is said to be unmatched.

The space between the inner conductor and the outer conductor is electrically insulating—it can comprise or consist of a vacuum or be filled with a dielectric material.

The line is traversed by currents moving in opposite directions along the core 21 and the envelope 22. These currents are generated by the alternating voltage source which excites the plasma by means of the RF electrode 31 which is in contact with the plasma.

These currents reduce and change direction—while also remaining in opposite directions to each other—twice in each alternating voltage cycle.

Note that because of the skin effect, high-frequency currents (“high frequencies” as used herein referring to frequencies above 1 MHz) flow at the surface of the conducting elements in which they are traveling (core 21, envelope 22, electrode 31, lid 32, etc.) and opposite, that is on the outside of the core 21 and on the outside of the envelope 22.

The probe 10 includes means 11 to measure the voltage between the current traversing the line 10 and an earth or a ground connected to the outer conductor 22, and means 12 to measure the current in this current.

The means 11 for measuring the voltage include:

- a conducting disk 110 placed close to the inner conductor 21 and connected to a conducting cable 111 which traverses the outer conductor 22, and
- a second conducting cable 112, connected to the outer conductor 22.

Measurement of the voltage V2 between the two cables 111 and 112 thus normally corresponds to the voltage that one wishes to measure.

However, a voltage measured between these two cables has certain limitations:

- firstly, the response of such a voltage probe is restricted in frequency,
- secondly the operation of the transmission line 20 is disrupted by the proximity of the disk 110 to the inner conductor 21, and
- finally the line 20 is partially short-circuited by the conductor 110, which can cause material breakdown, thus restricting the measurable voltage range.

The means 12 for measuring the current include a conducting loop 121 (or several loops in series) placed close to the inner conductor 21, one end of which is connected to ground or earth (connection to the outer conductor 22).

The inner conductor is traversed by the sinusoidal $I_{plasma}$ current that one wishes to measure.

This current induces a sinusoidal and azimuthal magnetic field (B), which induces a voltage (or electromotive force) between the ends of the loop 121. This constitutes an indirect technique for measuring the current, since it uses the magnetic field induced by the current to be measured.

The potential difference V1 measured between ground or earth and the end 1210 of the loop which is not connected to ground or earth is in principle proportional to the first derivative of the current ($I_{plasma}$) in the line.

In practice however, the loop 121 is also coupled capacitively to the central conductor which can add to the voltage measured at the terminals of the loop, a voltage which is proportional to the voltage ($V_{plasma}$) between the two conductors of the line 20.

This constitutes an additional voltage component which renders the measurement of the current less precise, and also disrupts the measurement of the phase offset between the current and the voltage.

Loop 121 disrupts line 20, since it forms a partial short-circuit between the two conductors 21 and 22, possibly leading to material breakdown. In practice, the use of such a loop is therefore generally limited to powers below 10 kW.

Moreover, because of the large size of the loop, it is also difficult to place a voltage sensor V2 close by without the current and voltage sensors disrupting each other. It is then necessary to move these two sensors away from each other—which then introduces an error into measurement of the phase offset between the current and the voltage.

It is generally necessary to very accurately calibrate such a known probe, in order to allow for the characteristics (geometry, size, etc.) of the loop 121.

Existing probes currently found in the targeted field of use employ variants of the probe described above.

In addition, these probes all employ indirect measurement of the current since they use the magnetic field induced by the currents flowing in the line 20.

Different versions of known probes can allow one to overcome one or more of the above-described limitations, but never to overcome all of them. For the purposes of illustration, probes are described in U.S. Pat. No. 5,834,931, U.S. Pat. No. 5,808,415, and U.S. Pat. No. 6,501,285.

Thus existing probes seeking to measure, in real time, the current and the voltage delivered by an RF generator to a plasma have various limitations.

SUMMARY OF THE INVENTION

One aim of the invention is to overcome at least some of these limitations.

Another aim of the invention is to allow the simultaneous and precise measurement of current and voltage at points that are very close to each other.

Still another aim of the invention is to allow such measurements over a broad range of powers.

Yet another aim of the invention is to allow such measurements over a wide range of frequencies.

In order to attain these objectives, the invention proposes, according to a first aspect, a probe for measuring the electrical characteristics of an excitation current of a plasma, with the probe being mounted on a conducting line which includes an inner conductor and an outer conductor, and includes a current sensor and a voltage sensor, characterized in that:

the current sensor includes:

a groove formed in a mass of one of the conductors in order to form a diversion for the current traversing the conductor, and a point for measuring the electrical voltage between an earth or a ground connected to the conductor and a point on the groove, with the current sensor thus being designed to measure a voltage that is proportional to the first temporal derivative of the amplitude of the excitation current and the voltage sensor is a derivative sensor, designed to measure a voltage that is proportional to the first temporal derivative of the voltage of the excitation current.

Preferred, but not limiting, aspects of the probe of the invention are:

- the excitation current is an alternating RF current,
- the groove forms a diversion with a length of one centimeter,
- the current sensor and the voltage sensor are both installed on the outer conductor,
- the voltage sensor includes a conical transmission line, terminated by a slightly curved surface capacitively coupled to the conductor other than that on which the voltage sensor is mounted,
- the coupling capacitance between the curved surface and the conductor other than that on which the voltage sensor is mounted is about 0.3 pF,
- the current sensor and the voltage sensor are installed at the same level in the path of the current at the surface of the conductor,
- the conducting line is a cylindrical coaxial line,
- the conducting line is a cylindrical radial line, and
- the probe includes means for measuring the phase offset between the current and the voltage of the excitation current.

According to a second aspect, the invention also proposes a plasma reactor that includes an RF generator and a probe as mentioned above.

Preferred but not limiting aspects of the reactor according to the invention are:

- the probe is installed between an impedance matching circuit connected to the RF generator and an RF electrode for excitation of the plasma, and
- the probe is installed between the RF generator and a matching unit, on a line described as matched.

BRIEF DESCRIPTION OF THE DRAWINGS

Other aspects, aims and advantages of the invention will appear more clearly on reading the description that follows, and which is provided with reference to the appended drawings.

DETAILED DESCRIPTION OF THE INVENTION

Figure 3:
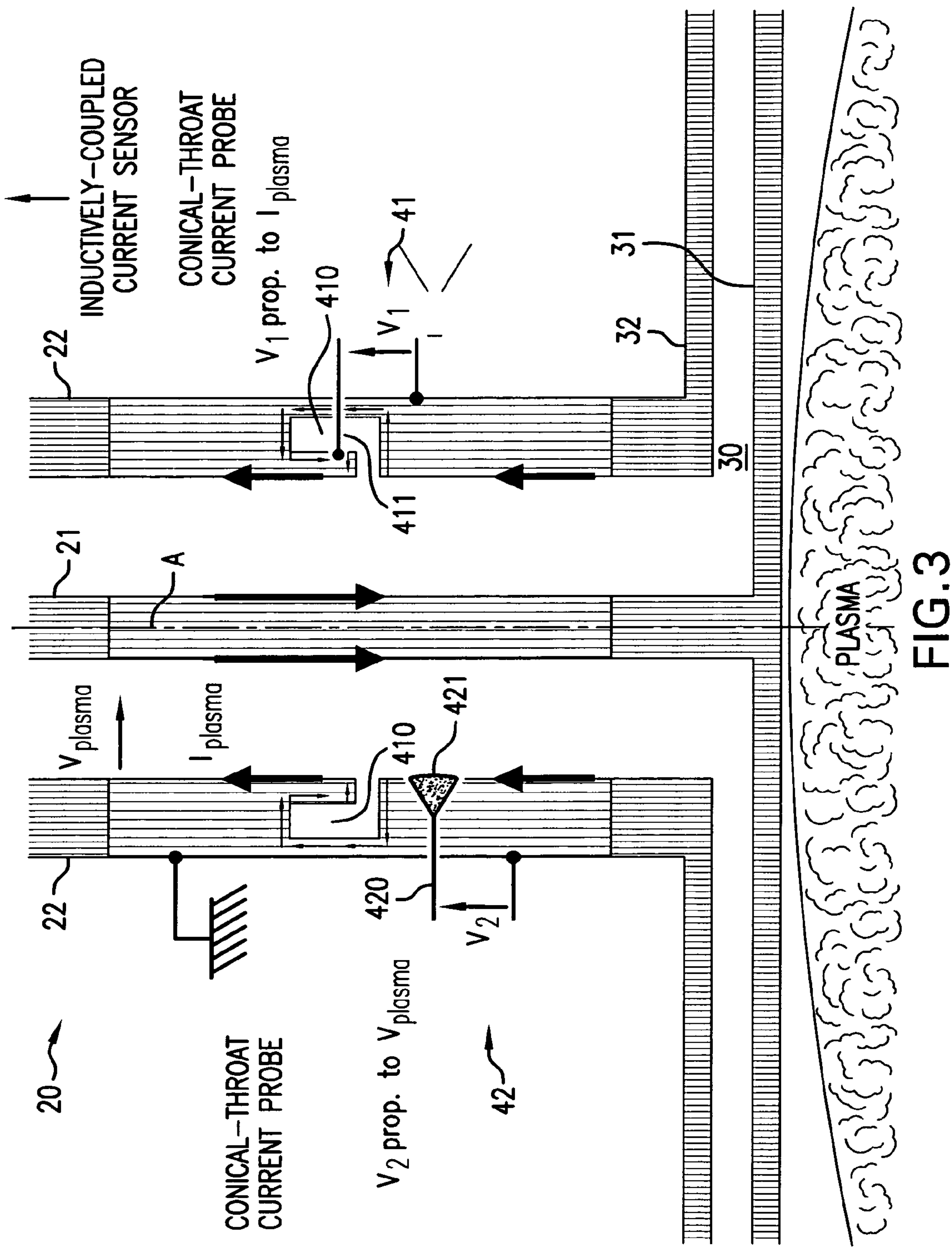
FIG. 3 is a diagram showing the principle of a probe for measuring current and voltage according to an embodiment of the invention.

FIG. 3 schematically represents a probe according to one embodiment of the invention.

The probe is mounted between an RF electrode and an impedance matching circuit connected to an RF generator (not shown).

As has been described above, an impedance matching circuit can be used in plasma processes in particular in order to optimize the transfer to the plasma of the power delivered by the RF generator.

Figure 2:
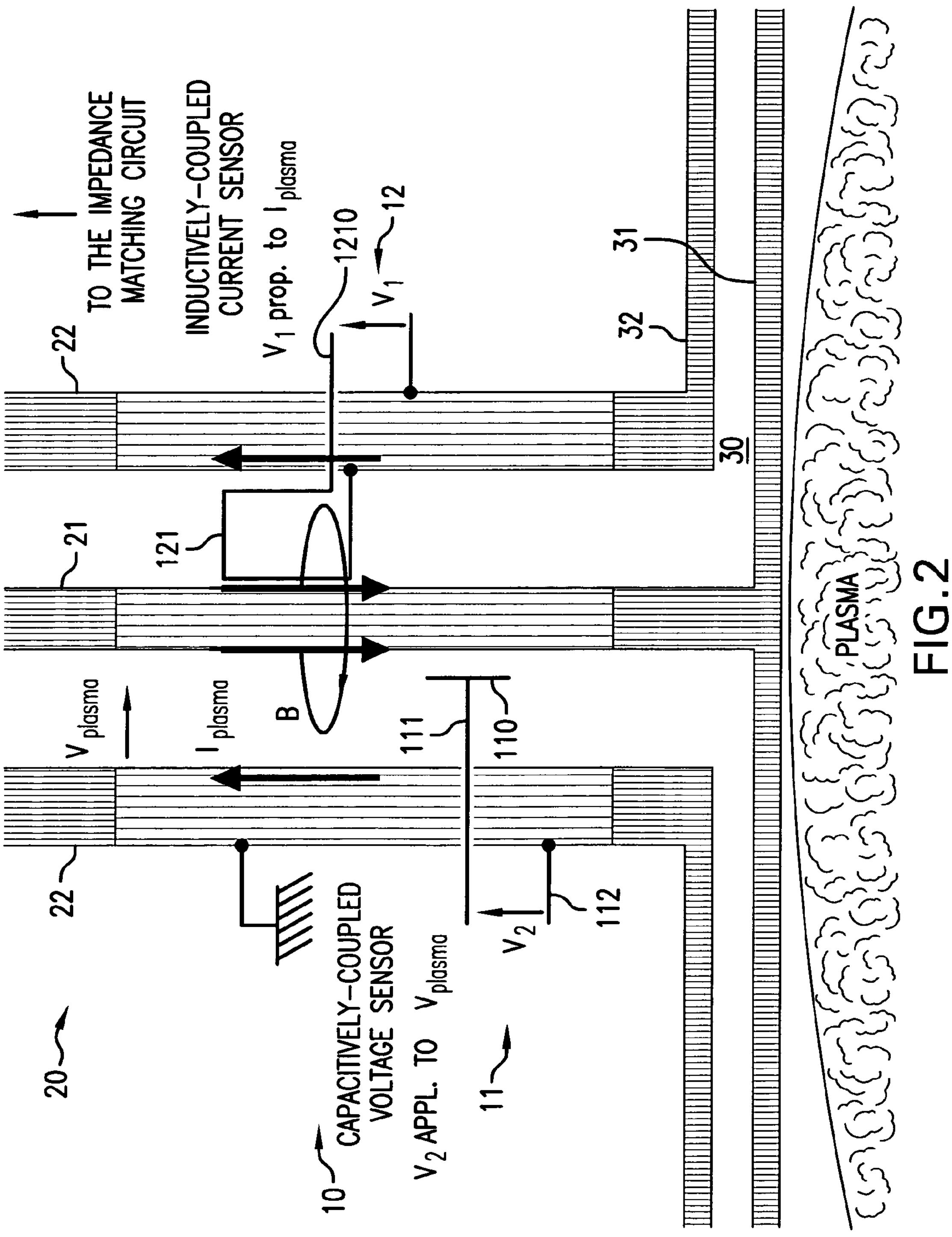
FIG. 2 presents, in longitudinal section, a probe mounted on an electrically conducting coaxial transmission line.

Note that the elements already mentioned in relation to the known probe shown in FIG. 2 will be referenced in the same way with reference to FIG. 3 (without being newly introduced).

This figure thus includes:

- a conducting coaxial transmission line 20 which includes an inner conductor 21 and an outer conductor 22, and
- an RF electrode 31 in form of disk, and an associated lid 32.

Note however that the probe according to the invention can be mounted differently, as described further below.

There is also a current sensor (here 41) and a voltage sensor (here 42). These sensors are specific to the invention.

It will be seen that these two sensors are placed extremely close to each other.

The probe according to the invention is desirably intended to simultaneously measure, at points that are extremely close to each other, the instantaneous current and voltage, in particular in plasmas using electrical power in the radio-frequency (RF) area.

This measurement is effected at a point on the transmission lines used to carry the electrical power, delivered by an RF generator, to the enclosure in which the plasma is contained. In particular, the invention will be advantageously implemented on transmission lines said to be unmatched.

The two sensors 41, 42 are therefore inserted in series in a section of the outer conductor 22, being separated by a distance only of the order of 5 millimeters.

Such a spacing is considered, in the context of the invention, to be negligible, and it will therefore be considered that the two sensors are installed at the same level in the path of the current at the surface of the conductor 22. This can also be expressed by saying that the two sensors 41 and 42 are installed in a plane (constant Z), with dimension Z being determined by axis A, which is parallel to the conductors 21 and 22.

The line 20 can be a cylindrical coaxial line, or any type of coaxial line in which an inner conductor is surrounded by an outer conductor.

The outer conductor 22 is connected to the electrical ground or earth of the system.

An RF voltage ($V_{plasma}$) is applied at the output of the matching circuit, between the inner and outer conductors, at the input of this section of line (that is at its top part in the representation of FIG. 3).

The resulting alternating RF current fully or partly traverses the plasma (shown below electrode 31) and returns via the outer conductor.

As mentioned previously above, in the high frequency (HF) area and above, the current flows at the surface of the conductors for a depth of a just a few micrometers. The current therefore flows at the surface of the central conductor and at the inner surface of the outer conductor.

The structure of the sensors 41 and 42 will now be described in detail.

First regarding sensor 41, a groove 410 is created in the inner face of the outer conductor 22 in order to cause the RF skin-effect current to travel an additional path (of the order of a centimeter in length). The path of the current on the walls of this groove is illustrated by arrows.

The groove is symmetrical in relation to the central axis (A) of the line 20. It therefore has a geometry of revolution in relation to this axis.

Means for measuring voltage V1 are associated with this groove.

These means measure the potential difference V1 between two points located on the diversion formed by the groove.

Figure 4:
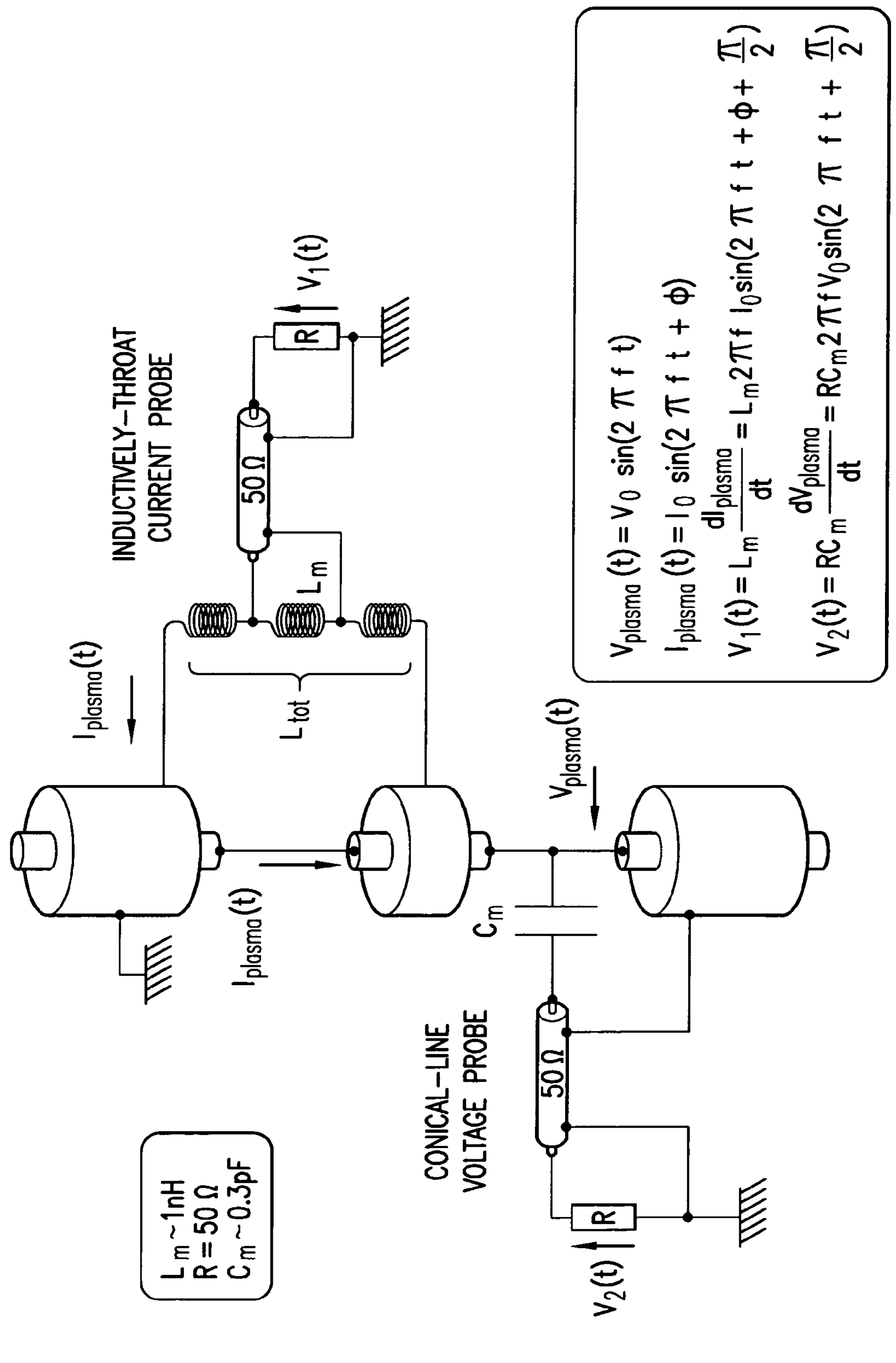
FIG. 4 is a representation of an electrical equivalent circuit for this probe according to one embodiment of the invention.

FIG. 4 depicts the equivalent electrical diagram of the probe.

The diversion of the groove 410 behaves as a low-value inductance ($L_m$—of the order of a nanohenry, which is not significant—in comparison with the simple self inductance of the conductors 21 and 22 typically a few tens of nanohenries per meter) placed in series in the path of the current.

The presence of this diversion therefore does not significantly alter the properties of this line.

In the diagram of FIG. 4, measurement of the voltage V1 amounts to measuring the voltage at the terminals of a portion ($L_m$) of the total inductance ($L_{tot}$).

The voltage at the terminals of the inductance $L_m$ is equal to the first temporal derivative of the current $I_{plasma}$ passing through it. Since this current is sinusoidal, the amplitude of the voltage measured is therefore proportional to $I_{plasma}$.

Figure 5A:
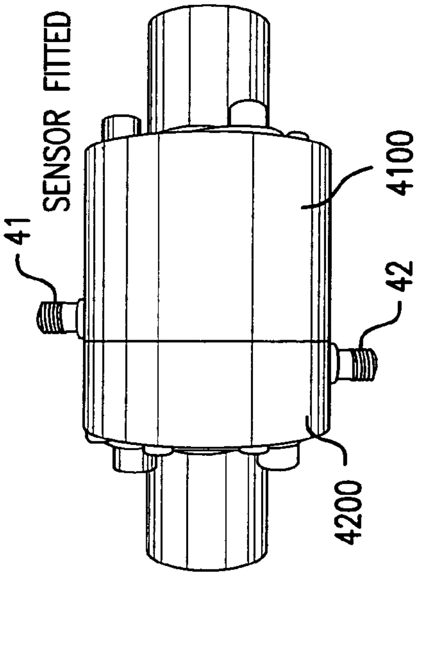
FIGS. 5*a* to 5*d* are views of a practical implementation of a probe according to one embodiment of the invention.
Figure 5B:
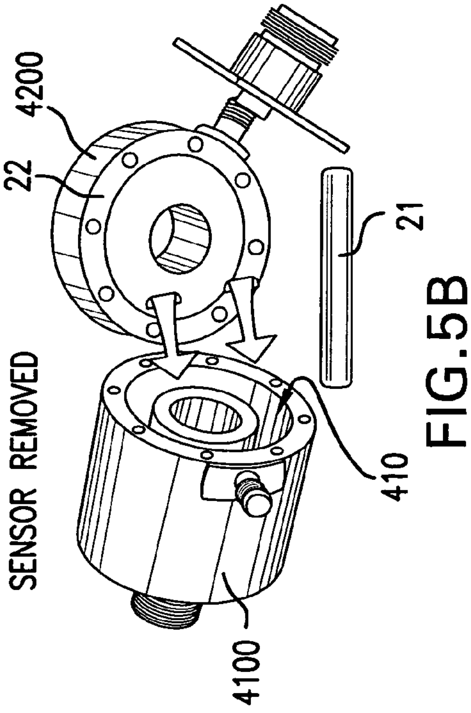
Figure 5C:
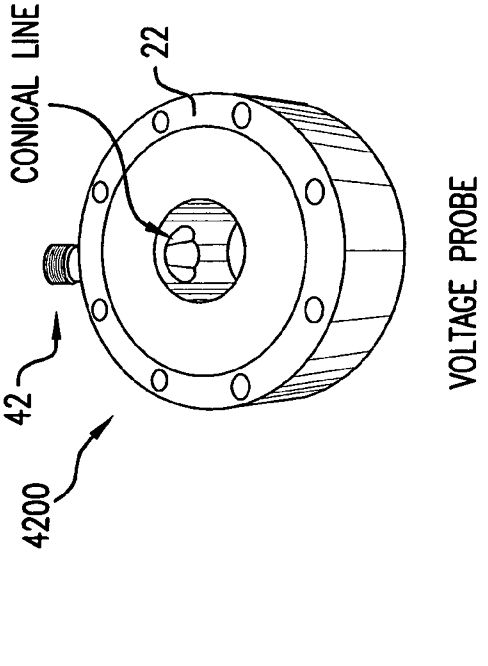
Figure 5D:
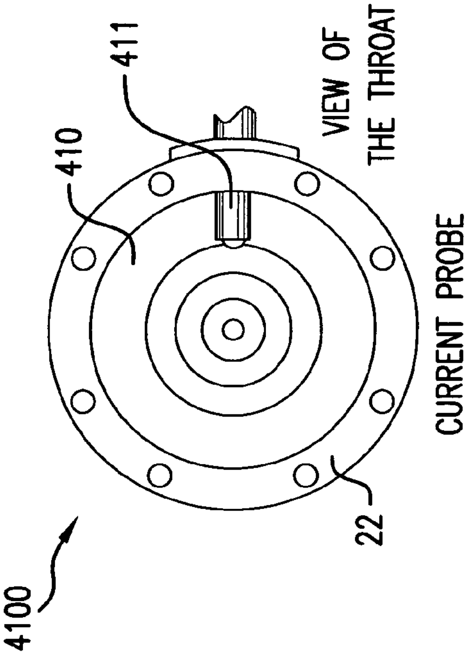

In order to perform the measurement of V1, a high-frequency coaxial socket 411 of the SMA type (50 ohms) is pressed from the outside into an orifice in the wall of the conductor 22 which opens into the groove (see FIG. 5*d*).

This socket 411 has a screw-type connector allowing the connection of a conventional coaxial cable (50 ohms) to convey the measured signal to a display device (oscilloscope, etc.) or an acquisition device (analogue-digital conversion card).

The current sensor 41 is a sensor of the "derivative" type. The measured signal (V1(*t*)) at the output of this sensor is phase offset by +π/2 in relation to the signal ($I_{plasma}$(t)) that one is seeking to measure.

The voltage sensor 42 is also derivative, which allows the use of the probe to measure phase offsets between the current and the voltage. With a voltage sensor 42 measuring a voltage phase offset of +π/2 in relation to voltage $V_{plasma}$, one gets a phase offset between the measurement signals V1 and V2 which is identical to the phase offset between the current ($I_{plasma}$) and the voltage ($V_{plasma}$) of the coaxial line.

The invention thus preferably uses a voltage sensor 42 that includes a transmission line 420 of the so-called "conical" type, terminated by a slightly curved surface 421 capacitively coupling to the inner conductor 21. The coupling capacitance between the surface 421 and the inner conductor is of the order of 0.3 pF.

In practice, the critical dimensions of the elements forming the probe (diameter of the conductors, spacing between inner and outer conductors, spacing between the two sensors of the probe, etc.) will be chosen as a function of operating parameters of the probe (range of voltage values to be measured, the precision that one wishes to obtain on the current-voltage phase offset, the frequency at which one is working, and so on). In any event, care will be taken to ensure adequate space between the inner and outer conductor to prevent material breakdown.

In one embodiment, the dimensions of the conical line are chosen so that its characteristic impedance is equal to 50 ohms—allowing the connection of this conical line to a coaxial transmission line constructed from an SMA socket identical to that used for the current sensor 41.

And here again, it is possible connect the output of the voltage sensor to a display and acquisition device with a coaxial cable.

The conical line of the sensor 42 is used:
- to guarantee the derivative operation of the probe over a wide frequency range, and
- while also keeping the voltage sensor away from the high voltage RF.

The conical line is partially embedded in the conductor 22 which is earthed or ground (see FIG. 5*c*).

It will be understood that although the conical lines are known as such, they have hitherto been employed for the measurement of very specific currents (transient currents of several mega-amperes in pulses of some hundred nanoseconds) which are very different from those employed in the present invention.

Moreover, placing the current sensor on the return conductor via earth or ground is very different from the usual practice employed in the profession. The earthed or ground outer conductor is considered to be a simple screen blocking the electromagnetic radiation emitted by the inner conductor, and not as a conductor carrying the electric return current, and which can be made use of.

Thus, in the context of the invention:
- in contrast to what is normally employed in RF metrology, the current is measured directly. To this end, one measures the voltage V1 which appears at the terminals of a diversion in which the RF current is forced to pass after having wholly or partly passed through the plasma, and
- the measurement of voltage is effected using a capacitively-coupled voltage probe extended by a conical line.

The capacitively-coupled voltage probe, which is commonly used in RF metrology, is here used with a conical line which guarantees derivative operation of the probe over a wide frequency range while also keeping the voltage sensor away from the RF high voltage.

The electrical equivalent circuit of the conical-line voltage sensor is shown in FIG. 4. Without the use of a conical line, there would be a parallel capacitor between the sensor and the earth or ground. This is the case with conventional voltage sensors. The presence of this additional component alters the frequency response of the sensor. In particular, it reduces the frequency range in which its response is derivative.

An advantage of a conical line is that it ensures a continuous transition between the curved sensor and the cylindrical coaxial line used to convey the measured voltage to a display and acquisition device. The purpose of this is to integrate this parasitic capacitor into those normally present between the two conductors of a coaxial line so that it will no longer alter the response of the probe.

In the embodiment illustrated in FIGS. 5*a* to 5*c*, the probe includes two main tubular elements 4100, 4200 which are intended to be aligned and assembled, with each of these two elements being associated respectively with a sensor of the probe (sensor 41 for element 4100, and sensor 42 for element 4200).

In this embodiment, element 4200 is used to close the groove of the current probe (see FIG. 5*b*), with the two sensors 41, 42 located as close as possible to the contact plane between the two elements 4100, 4200. The two probes are thus placed as close as possible to each other (see FIG. 5*a*).

The sensor prototype shown in FIGS. 5*a* to 5*c* is generally of cylindrical shape.

Its length is five centimeters with a diameter of 4.5 centimeters. It is composed essentially of brass. Here, it is a probe of the "repositionable" type, since it has screw-type coaxial connectors at its ends. The latter are of the N or HN type, for example, in order to make a good screen and to carry high powers. These connectors are modifiable, so that they can be adapted to fit the connectors (size and type) used on the transmission line on which one wished to conduct the electrical measurements. FIG. 5*a* shows a probe mounted with male coaxial connectors of the HN type. FIG. 5*b* shows a dismounted probe with coaxial connectors of the female N type.

The invention can also be placed on a transmission line in a permanent manner (without the screw connectors) as illustrated by the diagram of FIG. 3.

The transmission line on which the sensor is inserted is not necessarily cylindrical and coaxial. It can be a coaxial line of square or rectangular section. More generally the line should have two conductors, one enclosing the other and mainly working in an electromagnetic mode of the "TEM" (transverse electric and magnetic) type.

Figure 7:
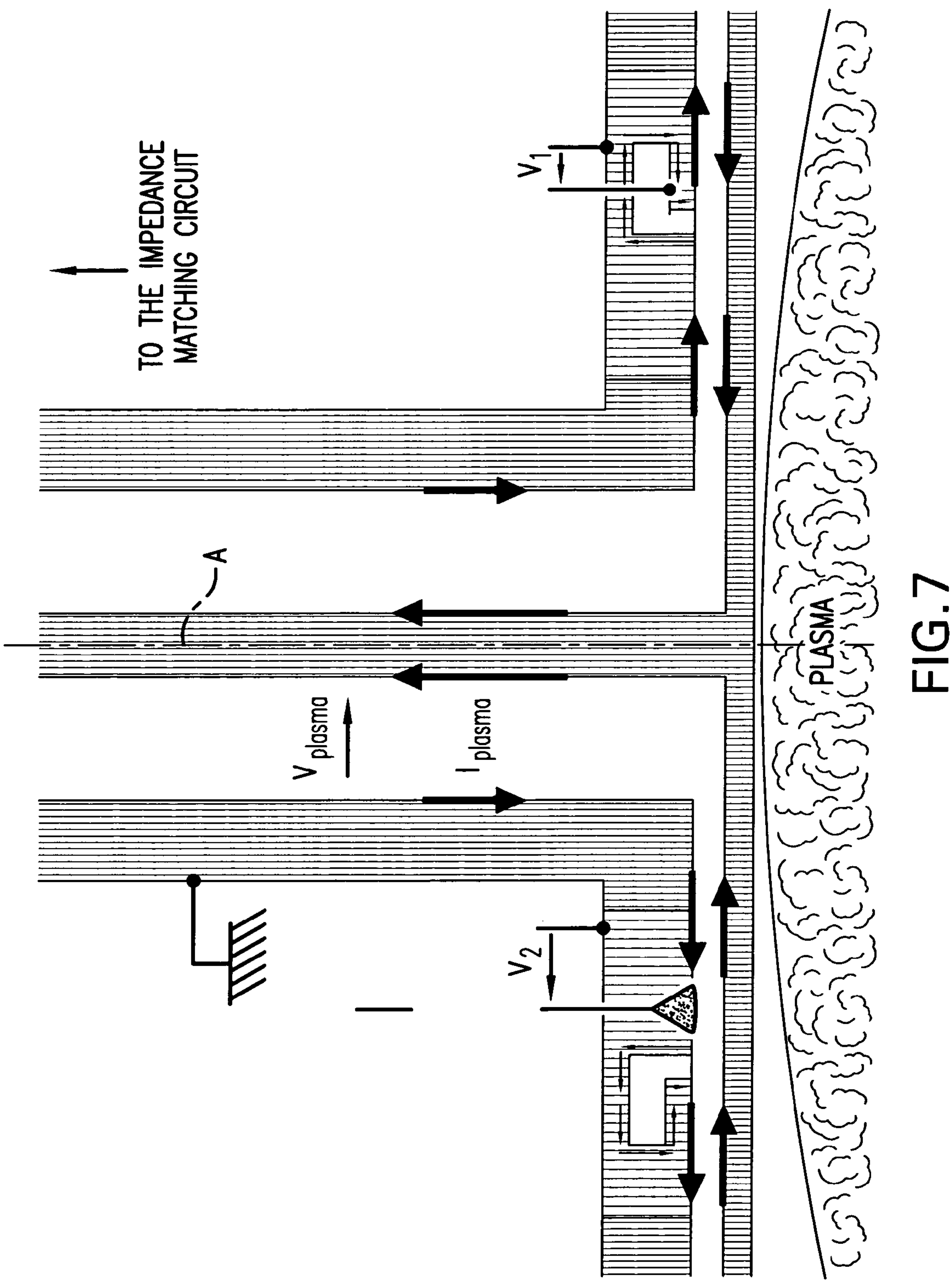
FIG. 7 illustrates an embodiment of the invention in which a probe according to the invention is installed in one embodiment of a radial line.

The line on which the sensor is installed can also be a radial line like that composed of an RF electrode 31 and a lid 32 in the shape of a concentric ring. In such a case the groove for diversion of the current can be executed in the wall of the lid that is facing the RF electrode. An example of installation of the invention on a radial line is shown in FIG. 7.

Figure 1:
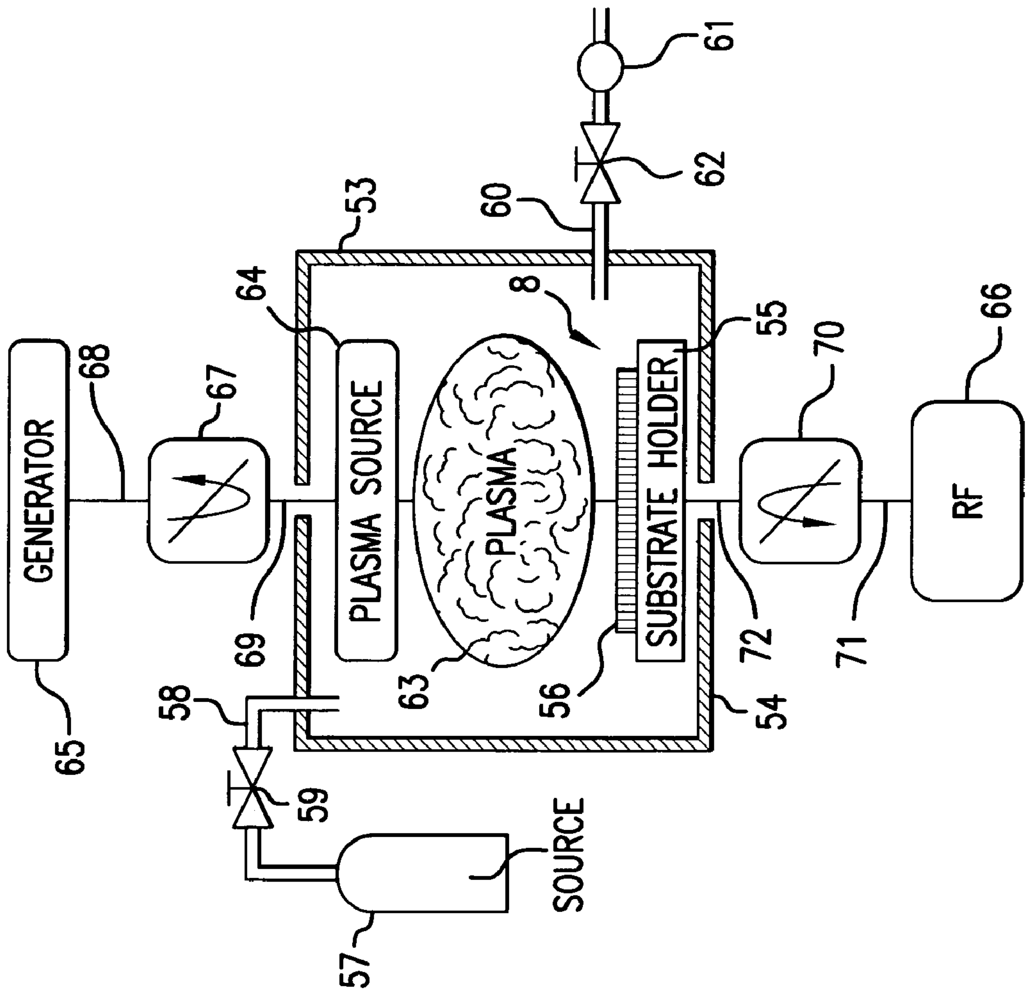
FIG. 1 schematically represents, in cross section, an example of a plasma reacter to which the invention can apply.

Since the sensor does not disrupt the line, it can be placed on a patched transmission line without any risk of a mismatch as, for example, on lines 68 and 71 of FIG. 1, located between the RF power generator and the impedance matching circuit.

Figure 6:
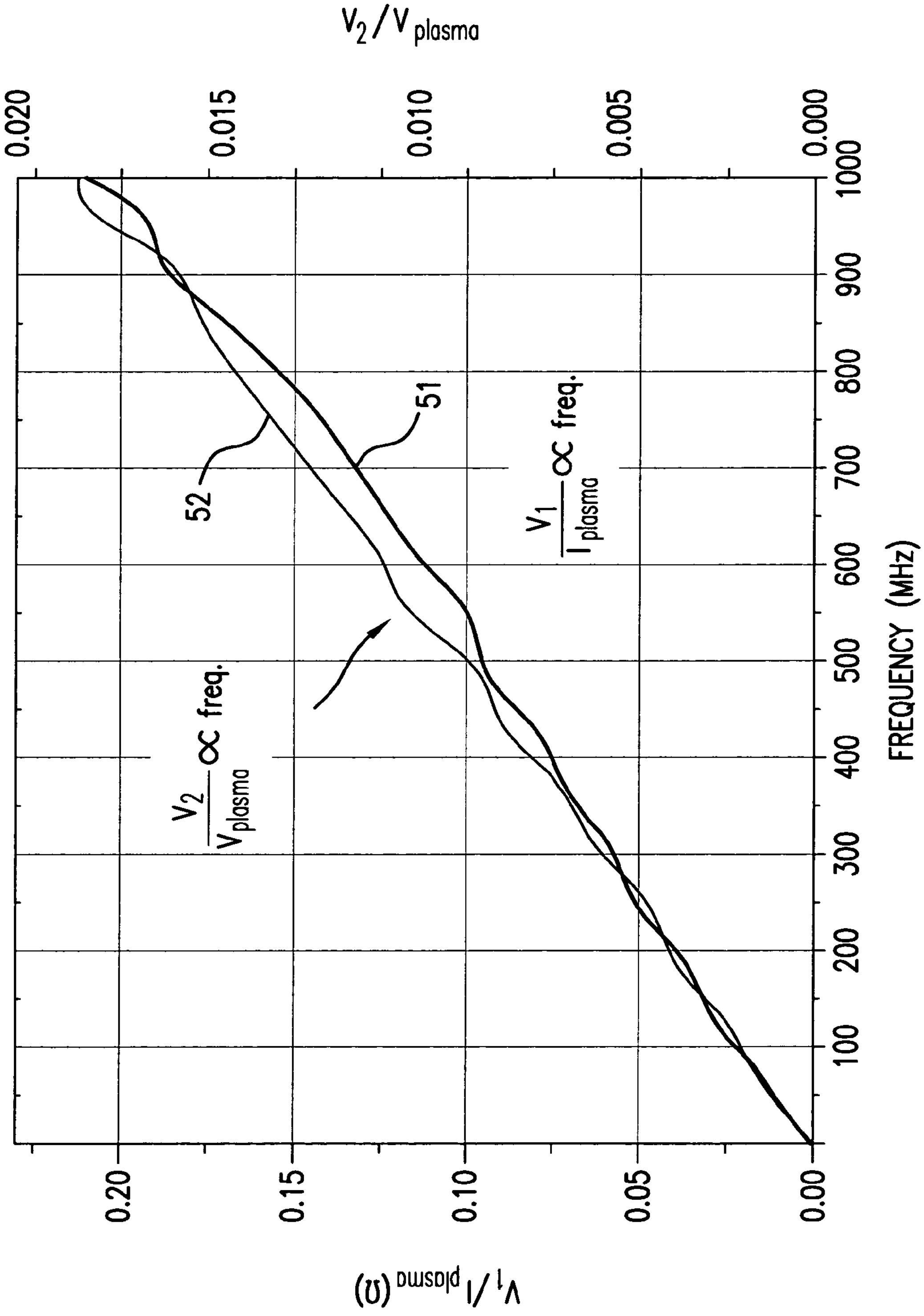
FIG. 6 illustrates the character proportional to the frequency (f) of the current and voltage measured by a probe according to the invention.

Prior to any metrological use, the sensor was calibrated (or characterized). FIG. 6 shows an example of the results of this calibration. This figure presents, from the measurements on V1 and V2:

$V1/I_{plasma}$ (line 51), and $V2/V_{plasma}$ (line 52).

It can be seen that these two lines, drawn against the RF frequency are close to straight, indicating that the sensors are operating derivatively (response is linear with frequency).

In the example illustrated here, this linear variation behavior with the frequency is particularly easy to see for frequencies of up to 500 MHz.

With industrial processes covered by the invention using a fundamental frequency (operating frequency of the RF generator) of less than 100 MHz, the probe whose calibration is illustrated in FIG. 6 is therefore usable to measure the amplitude of at least four of the first harmonics of the current and of the voltage in these industrial processes.

The voltage measured (V2) is thus proportional to the voltage to be measured ($V_{plasma}$, which can be called $V_0$) with a multiplying factor ($fV_0$) proportional to the frequency of the signal that one is seeking to measure (and this also applies to the current).

$$V_2(t) \propto \frac{d}{dt}\Bigg(\underbrace{V_0\sin(2\pi f t)}_{signal\ to\ be\ measured}\Bigg) \propto fV_0\sin\left(2\pi f t + \frac{\pi}{2}\right)$$

It will be understood that the probe according to the invention is particularly easy to build. The prototype illustrated in FIGS. 5*a* to 5*d*, and whose calibration graphs are shown in FIG. 6, required only the machining of four metal parts, the use of twelve screws for assembly, and the purchase of four coaxial connectors.

The machining of the parts was carried out without difficulty using the normal machine tools of the mechanical workshop (a machining tolerance of the order of a tenth of a millimeter was adequate). Finally the brass used to make the parts is a relatively inexpensive material.

Another advantage of the probe concerns its simple geometry. This geometry has the advantage of being easy to model using analytical calculation. It is therefore not necessary to make a large number of prototypes or to resort to complex computer modeling in order to design and dimension a probe according to the invention.

The probe of an embodiment of the invention also has a large capacity (use of sensors that are compact in themselves, embedded into a conductor connected to electrical earth). It is also possible to mount these sensors very close to each other without mutual interference.

The probe of the invention is also desirably designed to operate over wide ranges of frequency (typically between 1 MHz and 1 GHz), and is therefore not subject to the frequency range limitation of the known probes.

Another advantageous aspect of the invention concerns the fact that firstly the measurement of current is direct, since it does not use the magnetic field induced by the current to be measured, and secondly the groove provides its own screen in relation to variable external magnetic fields. Even in the presence of such fields, the voltage at the output of the current sensor is not affected by parasitic loses.

The linear frequency response favors the high frequencies over the low frequencies in the signal to be measured. This has two advantages:

firstly this renders the probe insensitive to the presence of low-frequency components (<100 kHz) due to instabilities in the plasma, and secondly this favors measurement of the harmonics, whose amplitude is always less than that of the fundamental: this amounts to "frequency compensation".

It should be noted that reversing the connection of the probe does not affect the voltage measurement but changes the sign of the current measurement (phase offset of $-\pi$).

The invention uses unintrusive sensors that are wholly or partly embedded in a conductor connected to electrical earth or ground. This feature greatly reduces the risk of material breakdown (from short-circuits) caused by the presence of the sensors.

The probe of this present invention can therefore measure voltages and currents that are much greater than the conventional devices.

It should be added finally that the "direct" measurement of current and voltage proportional to the frequency (mod ($I_{plasma}$ and $V_{plasma}$) renders still easier the use of the probe of the invention at high frequencies for reliable measurements—this advantage being reinforced by the fact that plasma processes are currently changing toward increasingly high frequencies.

The invention claim is:

1. A probe for measuring electrical characteristics of an excitation current of a plasma, said probe comprising a current sensor and a voltage sensor, said probe being mounted on a conducting line which includes an inner conductor and an outer conductor, wherein the current sensor comprises:

a groove formed in a mass of one of the conductors to form a diversion for current traversing the conductor, and a point for measuring the electrical voltage between an earth or a ground connected to the conductor and a point on the groove, the current sensor measuring a voltage proportional to a first temporal derivative of the excitation current, and the voltage sensor is a derivative sensor, measuring a voltage proportional to a first temporal derivative of the excitation current voltage.

2. A probe according to claim 1, wherein the excitation current is an alternating RF current.

3. A probe according to claim 1, wherein the groove creates a current diversion with a length of about centimeter.

4. A probe according to claim 1, wherein the current sensor and the voltage sensor are both installed on the outer conductor.

5. A probe according to claim 1, wherein the said voltage sensor includes a conical transmission line, terminated by a curved surface capacitively coupled to the conductor other than that on which the said voltage sensor is mounted.

6. A probe according to claim 5, wherein a coupling capacitance between the curved surface and the conductor other than that on which the voltage sensor is mounted, is about 0.3 pF.

7. A probe according to claim 1, wherein the current sensor and the voltage sensor are installed at the same level in a current path at the surface of the conductor.

8. A probe according to claim 1, wherein the conducting line is a cylindrical coaxial line.

9. A probe according to claim 1, wherein the conducting line is a radial coaxial line.

10. A probe according to claim 1, additionally comprising means for measuring the phase offset between the current and the voltage of the excitation current.

11. A plasma reactor that comprises an RF generator additionally comprising a probe according to claim 1.

12. A reactor according to claim 11, wherein the probe is disposed between an impedance matching circuit connected to the RF generator and an RF electrode for excitation of the plasma.

13. A reactor according to claim 11, wherein the probe is disposed between the RF generator and a matching unit, on a matched line.

* * * * *